(12) United States Patent
Kim et al.

(10) Patent No.: US 12,518,963 B2
(45) Date of Patent: Jan. 6, 2026

(54) COMPOSITION FOR DEPOSITING SILICON-CONTAINING THIN FILM AND METHOD FOR MANUFACTURING SILICON-CONTAINING THIN FILM USING THE SAME

(71) Applicant: DNF CO., LTD., Daejeon (KR)

(72) Inventors: Sung Gi Kim, Daejeon (KR); Jeong Joo Park, Daejeon (KR); Joong Jin Park, Daejeon (KR); Se Jin Jang, Jeju-si (KR); Byeong-il Yang, Daejeon (KR); Sang-Do Lee, Daejeon (KR); Sam Dong Lee, Daejeon (KR); Sang Ick Lee, Daejeon (KR); Myong Woon Kim, Daejeon (KR)

(73) Assignee: DNF CO., LTD., Daejeon (KR)

( * ) Notice: Subject to any disclaimer, the term of this patent is extended or adjusted under 35 U.S.C. 154(b) by 552 days.

(21) Appl. No.: 17/653,217

(22) Filed: Mar. 2, 2022

(65) Prior Publication Data

US 2023/0089296 A1  Mar. 23, 2023

Related U.S. Application Data

(63) Continuation-in-part of application No. 16/499,216, filed as application No. PCT/KR2018/003682 on Mar. 29, 2018, now abandoned.

(30) Foreign Application Priority Data

Mar. 29, 2017 (KR) .......................... 10-2017-0040078
Mar. 27, 2018 (KR) .......................... 10-2018-0035166

(51) Int. Cl.
*H01L 21/02* (2006.01)
*C01B 21/068* (2006.01)
(Continued)

(52) U.S. Cl.
CPC ...... *H01L 21/02211* (2013.01); *C01B 21/068* (2013.01); *C01B 33/126* (2013.01);
(Continued)

(58) Field of Classification Search
CPC .......... H01L 21/0217; H01L 21/02219; C07F 7/10
See application file for complete search history.

(56) References Cited

U.S. PATENT DOCUMENTS

2008/0102613 A1* 5/2008 Elers ................... H01L 29/4966
438/584
2009/0095346 A1 4/2009 Hurley et al.
(Continued)

FOREIGN PATENT DOCUMENTS

CN  103401019 A  11/2013
CN  105377860 A  3/2016
(Continued)

OTHER PUBLICATIONS

ISA Korean Intellectual Property Office, International Search Report Issued in Application No. PCT/KR2018/003682, Jul. 13, 2018, WIPO, 2 pages.
(Continued)

*Primary Examiner* — Michele Fan
(74) *Attorney, Agent, or Firm* — McCoy Russell LLP

(57) ABSTRACT

Provided is a composition containing a silylamine compound and a method for manufacturing a silicon-containing thin film using the same, and more particularly, a composition for depositing a silicon-containing thin film, containing a silylamine compound capable of forming a silicon-containing thin film having a significantly excellent water vapor transmission rate to thereby be usefully used as a precursor of the silicon-containing thin film and an encapsulant of a display, and a method for manufacturing a silicon-containing thin film using the same.

13 Claims, 6 Drawing Sheets

(51) Int. Cl.

| | | |
|---|---|---|
| *C01B 33/12* | (2006.01) | |
| *C07F 7/10* | (2006.01) | |
| *C23C 16/34* | (2006.01) | |
| *C23C 16/40* | (2006.01) | |
| *C23C 16/455* | (2006.01) | |
| *C23C 16/50* | (2006.01) | |

(52) U.S. Cl.
CPC .............. *C07F 7/10* (2013.01); *C23C 16/345* (2013.01); *C23C 16/401* (2013.01); *C23C 16/45536* (2013.01); *C23C 16/45553* (2013.01); *C23C 16/50* (2013.01); *H01L 21/02126* (2013.01); *H01L 21/0214* (2013.01); *H01L 21/02164* (2013.01); *H01L 21/02167* (2013.01); *H01L 21/0217* (2013.01); *H01L 21/0228* (2013.01)

(56) References Cited

U.S. PATENT DOCUMENTS

| | | | |
|---|---|---|---|
| 2014/0287164 A1* | 9/2014 | Xiao | H01L 21/0228 546/14 |
| 2014/0363985 A1* | 12/2014 | Jang | C07F 7/10 556/412 |
| 2015/0044858 A1 | 2/2015 | Mori et al. | |
| 2016/0122369 A1* | 5/2016 | Jang | C07F 7/10 556/412 |
| 2016/0280724 A1 | 9/2016 | Arkles et al. | |
| 2017/0025640 A1* | 1/2017 | Kim | H10K 50/8445 |
| 2019/0245162 A1* | 8/2019 | Lee | H10K 50/844 |
| 2020/0212355 A1* | 7/2020 | Li | C08J 7/043 |

FOREIGN PATENT DOCUMENTS

| | | |
|---|---|---|
| EP | 2264218 A1 | 12/2010 |
| EP | 2669249 A1 | 12/2013 |
| JP | H01129972 A | 5/1989 |
| JP | H02265242 A | 10/1990 |
| JP | 2008074847 A | 4/2008 |
| JP | 2014523638 A | 9/2014 |
| JP | 2014237644 A | 12/2014 |
| KR | 20140143682 A | 12/2014 |
| KR | 20160051307 A | 5/2016 |
| KR | 2017124108 A * | 11/2017 |
| WO | 2008038255 A1 | 4/2008 |
| WO | 2014196827 A2 | 12/2014 |
| WO | 2016049154 A1 | 3/2016 |

OTHER PUBLICATIONS

Japanese Patent Office, Office Action Issued in Application No. 2019-552856, Nov. 27, 2020, 7 pages.

Freza, S. et al., "Influence of substituents in vinyl groups on reactivity of parylene during polymerization process," Chemical Physics, vol. 368, No. 3, Mar. 11, 2010, Available Online Jan. 28, 2010, 7 pages.

ISA Korean Intellectual Property Office, International Search Report Issued in Application No. PCT/KR2018/003655, Jul. 13, 2018, WIPO, 2 pages.

State Intellectual Property Office of the People's Republic of China, Office Action and Search Report Issued in Application No. 201880019422.X, Nov. 13, 2020, 13 pages. (Submitted with Partial Translation).

Japanese Patent Office, Office Action Issued in Application No. 2019-553053, Nov. 27, 2020, 9 pages.

United States Patent and Trademark Office, Office Action Issued in U.S. Appl. No. 16/499,196, May 24, 2021, 19 pages.

"CAS Number: 23636-57-9," ichemistry Website, Available Online at http://www.ichemistry.cn/chemistry/23636-57-9.htm, Retrieved on Dec. 1, 2021, 3 pages. (See NPL 1, Office Action Issued in U.S. Appl. No. 16/499,196 for Explanation of Relevancy).

United States Patent and Trademark Office, Office Action Issued in U.S. Appl. No. 17/572,509, filed Feb. 16, 2023, 11 pages.

* cited by examiner

COMPOSITION FOR DEPOSITING SILICON-CONTAINING THIN FILM AND METHOD FOR MANUFACTURING SILICON-CONTAINING THIN FILM USING THE SAME

CROSS-REFERENCE TO RELATED APPLICATIONS

The present application is a continuation-in-part of U.S. Non-Provisional patent application Ser. No. 16/499,216, entitled "COMPOSITION FOR DEPOSITING SILICON-CONTAINING THIN FILM AND METHOD FOR MANUFACTURING SILICON-CONTAINING THIN FILM USING THE SAME", and filed on Sep. 27, 2019. U.S. Non-Provisional patent application Ser. No. 16/499,216 is a U.S. National Phase of International Patent Application Serial No. PCT/KR2018/003682 entitled "COMPOSITION FOR DEPOSITING SILICON-CONTAINING THIN FILM AND METHOD FOR MANUFACTURING SILICON-CONTAINING THIN FILM USING THE SAME," filed on Mar. 29, 2018. International Patent Application Serial No. PCT/KR2018/003682 claims priority to Korean Patent Application No. 10-2017-0040078 filed on Mar. 29, 2017 and Korean Patent Application No. 10-2018-0035166 filed on Mar. 27, 2018. The entire contents of each of the above-listed application are hereby incorporated by reference for all purposes.

TECHNICAL FIELD

The following disclosure relates to a composition for depositing a silicon-containing thin film and a method for manufacturing a silicon-containing thin film using the same, and more particularly, to a composition for depositing a silicon-containing thin film, containing a silylamine compound as a precursor for depositing a thin film, and a method for manufacturing a silicon-containing thin film using the same.

BACKGROUND

A silicon-containing thin film is manufactured through various deposition processes in the semiconductor field to thereby be manufactured in various forms such as a silicon film, a silicon oxide film, a silicon nitride film, a silicon carbonitride film, and a silicon oxynitride film, and an application field of the silicon-containing thin film may be wide.

Particularly, since the silicon oxide film and the silicon nitride film have an excellent barrier property and oxidation resistance, the silicon oxide film and the silicon nitride film are used as an insulating film, a diffusion barrier, a hard mask, an etch stop layer, a seed layer, a spacer, a trench isolation, an intermetallic dielectric material, and a passivation layer in manufacturing an apparatus.

Recently, a polycrystalline silicon thin film has been used in a thin film transistor (TFT), a solar cell, and the like, and an application field thereof has been gradually diversified.

As a representative technology for manufacturing a silicon-containing thin film known in the art, there is a metal-organic chemical vapor deposition (MOCVD) method for reacting a gas-type silicon precursor and a reaction gas with each other to form a film on a surface of a substrate or directly reacting the gas-type silicon precursor and the reaction gas with each other on the surface to form a film and an atomic layer deposition (ALD) method for physically or chemically adsorbing a gas-type silicon precursor and sequentially injecting a reaction gas to form a film. Various technologies for manufacturing a thin film such as a low-pressure chemical vapor deposition (LPCVD) method applying the above-mentioned method, a plasma-enhanced chemical vapor deposition (PECVD) method and a plasma-enhanced atomic layer deposition (PEALD) method capable of performing deposition at a low temperature, and the like, are applied to processes for manufacturing next-generation semiconductors and display devices to thereby be used to form a ultra-fine pattern and deposit an ultra-thin film having uniform and excellent properties at a nano-scale thickness.

Representative examples of a precursor used to form the silicon-containing thin film may include silane, silane compounds, aminosilane, and alkoxysilane compounds. Specific examples thereof may include silane chloride compounds such as dichlorosilane ($SiH_2Cl_2$) and hexachlorodisilane ($Cl_3SiSiCl_3$), trisilylamine ($N(SiH_3)_3$), bis-diethylaminosilane ($H_2Si(N(CH_2CH_3)_2)_2$), di-isopropylaminosilane ($H_3SiN(i-C_3H_7)_2$), and the like. These precursors have been used in mass-production processes for manufacturing semiconductors and displays.

However, due to the miniaturization of semi-conductor devices due to the ultra-high integration of the devices, an increase in the aspect ratio, and diversification of materials of the devices, a technology for forming an ultra-fine thin film having a uniform and thin thickness and excellent electrical properties at a low temperature has been sought. High-temperature processes (600° C. or more) using existing silicon precursors, step coverage, etching properties, and physical and electric properties of the thin film have become problematic, leading to an interest in developing a novel silicon precursor and method for forming a thin film.

SUMMARY

In one embodiment, provided herein is a composition for depositing a silicon-containing thin film, containing a silylamine compound capable of being used as a precursor of the silicon-containing thin film.

In another embodiment, provided herein is a method for manufacturing a silicon-containing thin film using the composition for depositing a silicon-containing thin film.

In one embodiment, there is provided a composition for depositing a silicon-containing thin film, containing a silylamine compound having excellent cohesive force, a high deposition rate, and excellent physical and electrical properties as a precursor for depositing a silicon-containing thin film, the silylamine compound being represented by the following Chemical Formula 1:

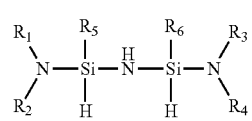

Chemical Formula 1

In Chemical Formula 1, $R_1$ to $R_4$ are each independently hydrogen, $C_1$-$C_7$ alkyl, or $C_2$-$C_7$ alkenyl, or $R_1$ and $R_2$, and $R_3$ and $R_4$ are each independently linked to each other to form a ring; and $R_5$ and $R_6$ are each independently $C_1$-$C_7$ alkyl, or $C_2$-$C_7$ alkenyl.

In certain embodiments, in the silylamine compound represented by Chemical Formula 1, $R_5$ and $R_6$ may be each independently $C_1$-$C_5$ alkyl.

In certain embodiments, the silylamine compound represented by Chemical Formula 1 may be represented by the following Chemical Formula 2 or 3:

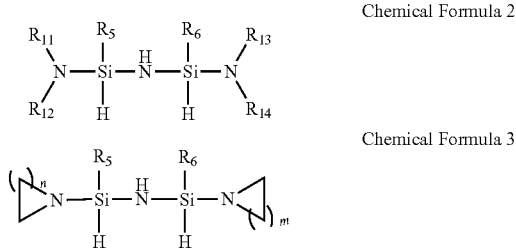

Chemical Formula 2

Chemical Formula 3

In Chemical Formula 2 or 3, $R_{11}$ to $R_{14}$ are each independently hydrogen, $C_1$-$C_5$ alkyl, or $C_2$-$C_5$ alkenyl; $R_5$ and $R_6$ are each independently $C_1$-$C_5$ alkyl, or $C_2$-$C_5$ alkenyl; and n and m are each independently an integer of 1 to 7.

In certain embodiments, in Chemical Formula 2 or 3, $R_5$ and $R_6$ may be each independently $C_1$-$C_5$ alkyl; and n and m may be each independently an integer of 1 to 4.

In certain embodiments, the silylamine compound represented by Chemical Formula 1 may be selected from the following compounds but is not limited thereto:

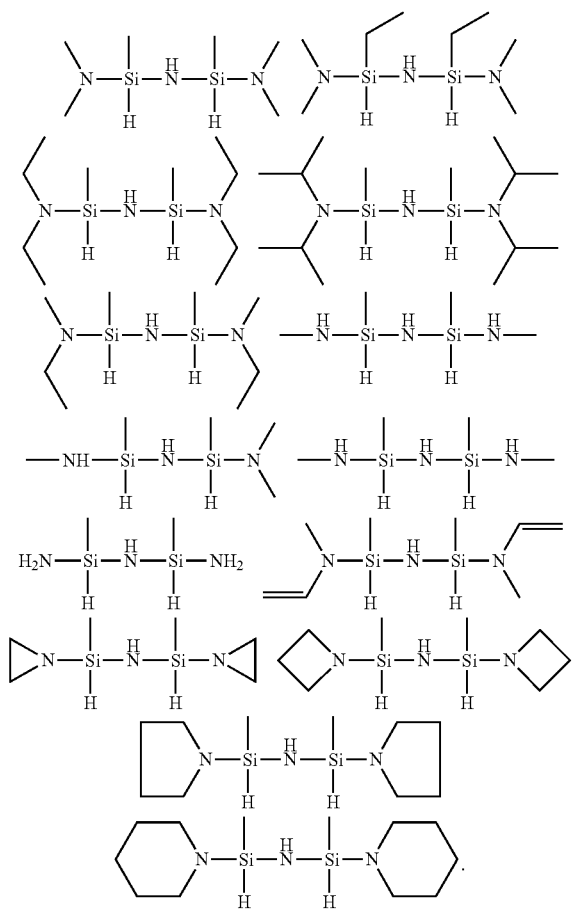

In another embodiment, there is provided a method for manufacturing a silicon-containing thin film comprising the step of:

A) providing a substrate in a reactor;
B) introducing into the reactor at least one silicon precursor; and
wherein the at least one silicon precursor has a following Chemical Formula 1:

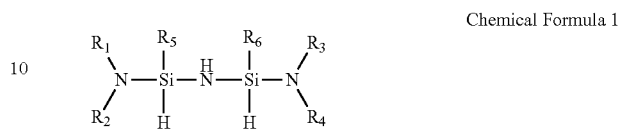

Chemical Formula 1 wherein $R_1$ to $R_4$ are each independently hydrogen, $C_1$-$C_7$ alkyl, or $C_2$-$C_7$ alkenyl, or $R_1$ and $R_2$, and $R_3$ and $R_4$ are each independently linked to each other to form a ring; and $R_5$ and $R_6$ are each independently $C_1$-$C_7$ alkyl, or $C_2$-$C_7$ alkenyl.

In certain embodiments of Chemical Formula 1, $R_5$ and $R_6$ may be each independently $C_{1-5}$ alkyl.

In certain embodiments, the silicon precursor of Chemical Formula 1 may be represented by Chemical Formula 2 or 3:

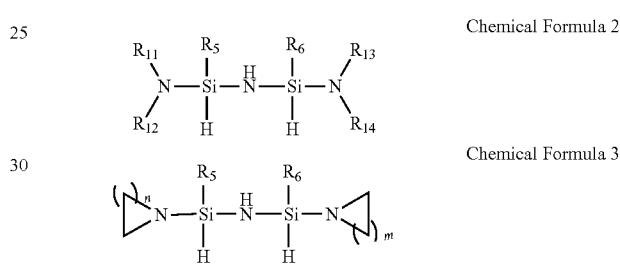

Chemical Formula 2

Chemical Formula 3 wherein $R_{11}$ to $R_{14}$ are each independently hydrogen, $C_1$-$C_5$ alkyl, or $C_2$-$C_5$ alkenyl; $R_5$ and $R_6$ are each independently $C_1$-$C_5$ alkyl, or $C_2$-$C_5$ alkenyl; and n and m are each independently an integer of 1 to 7.

In certain embodiments, in Chemical Formula 2 or 3, $R_5$ and $R_6$ may be each independently $C_1$-$C_5$ alkyl; and n and m are each independently 1, 2, or 5 to 7.

In certain embodiments, the silicon precursor represented by Chemical Formula 1 may be selected from the following compounds but is not limited thereto:

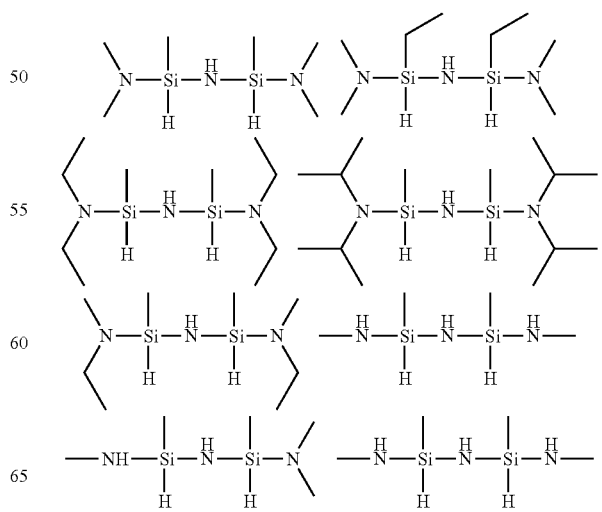

-continued

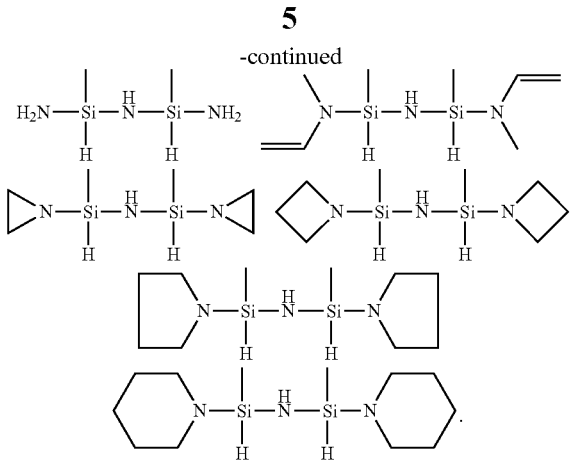

In certain embodiments, the silicon-containing thin film may be formed by an atomic layer deposition (ALD) method, a chemical vapor deposition (CVD) method, a metal-organic chemical vapor deposition (MOCVD) method, a low-pressure chemical vapor deposition (LPCVD) method, a plasma-enhanced chemical vapor deposition (PECVD) method, and/or a plasma-enhanced atomic layer deposition (PEALD) method.

In certain embodiments, the silicon-containing thin film may be a silicon oxide ($SiO_2$) film, a silicon oxy carbide (SiOC) film, a silicon oxy caronitride (BCN) film, a silicon nitride (SiN) film, a silicon oxy nitride (SiON) film, a silicon carbonitride (SiCN) film, and/or a silicon carbide (SiC) film.

In certain embodiments, the method for manufacturing a silicon-containing thin film comprising:

a) maintaining a temperature of the substrate mounted in a chamber at 30 to 500° C.;

b) contacting the silicon precursor has the Chemical Formula 1 with the substrate to adsorb the silicon precursor in the substrate; and c) injecting a reaction gas into the substrate in which the silicon precursor is adsorbed to form a silicon-containing thin film.

In certain embodiments, the reaction gas may be supplied after being activated by generating plasma at a plasma power of 50 to 1000 W.

In certain embodiments, the temperature of the substrate is maintained at 50 to 200° C.

In another embodiment, there is provided a silicon-containing thin film manufactured by the method according to an embodiment.

In certain embodiments, the silicon-containing thin film can have a water vapor transmission rate of about 5.2E-2 g/(m²-day) or less as measured by ISO 15106-3 test method (Temperature 37.8° C., Barometric Pressure 760.00 mmHg, Relative Humidity 100.0%).

In certain embodiments, the silicon-containing thin film can have a water vapor transmission rate of about 2.2E-2 g/(m²-day) or less as measured by ISO 15106-3 test method (Temperature 37.8° C., Barometric Pressure 760.00 mmHg, Relative Humidity 100.0%).

In another embodiment, there is provided a display encapsulant comprising a silicon-containing thin film manufactured by the method according to an embodiment.

In another embodiment, there is provided an insulating film of a semiconductor device comprising a silicon-containing thin film manufactured by the method according to an embodiment.

DETAILED DESCRIPTION

Figure 1:
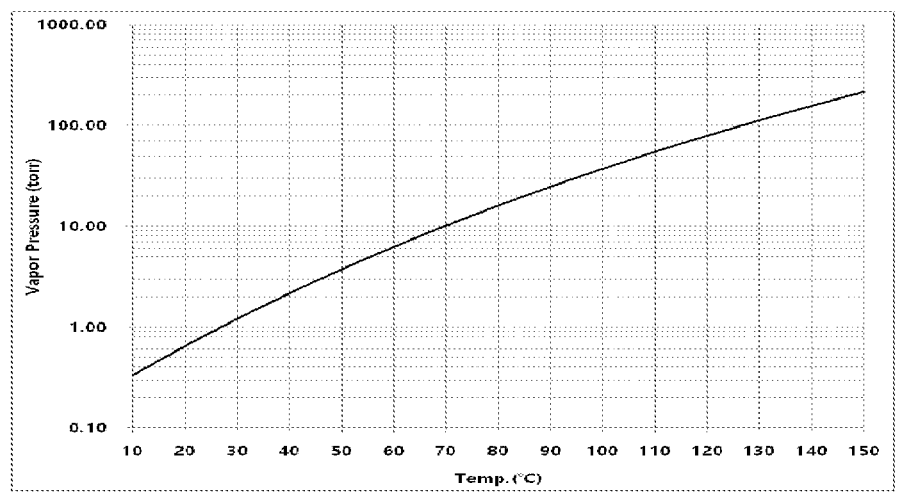
FIG. 1 is a graph illustrating a result obtained by measuring a vapor pressure of a bis(dimethylaminomethylsilyl)amine compound prepared in Example 1.

The following disclosure provides a composition for depositing a silicon-containing thin film containing a silylamine compound represented by the following Chemical Formula 1, which is a liquid at room temperature and has high volatility and excellent thermal stability to thereby be used as a useful precursor for forming a silicon-containing thin film, wherein the silylamine compound is represented by the following Chemical Formula 1:

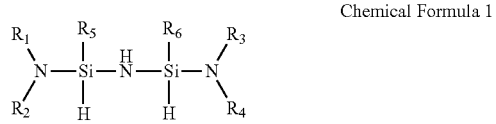

Chemical Formula 1 wherein $R_1$ to $R_4$ are each independently hydrogen, $C_1$-$C_7$ alkyl, or $C_2$-$C_7$ alkenyl, or $R_1$ and $R_2$, and $R_3$ and $R_4$ are each independently linked to each other to form a ring; and $R_5$ and $R_7$ are each independently $C_1$-$C_7$ alkyl or $C_2$-$C_7$ alkenyl.

In the silylamine compound contained in the composition for depositing a silicon-containing thin film, amine has two aminosilyl functional groups as substituents, such that the silylamine compound, which is a liquid at room temperature, has high volatility. Therefore, the silylamine compound may be significantly usefully used to form the silicon-containing thin film.

In one embodiment, the silylamine compound is a compound having a silazane backbone, but necessarily has two aminosilyl functional groups

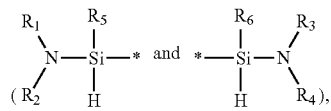

and only when each silicon atom of the aminosilyl functional groups necessarily has one hydrogen atom attached thereto, the silylamine compound may have useful effects as a precursor for depositing a thin film.

In one embodiment, in the silylamine compound represented by Chemical Formula 1, $R_5$ and $R_6$ may be each independently $C_1$-$C_5$ alkyl.

In one embodiment, the silylamine compound represented by Chemical Formula 1 may be represented by the following Chemical Formula 2 or 3:

Chemical Formula 2

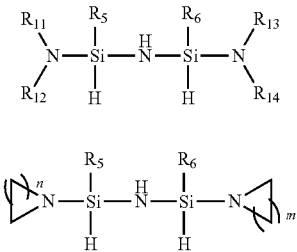

Chemical Formula 3

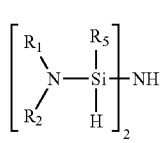

wherein $R_{11}$ to $R_{14}$ are each independently hydrogen, $C_1$-$C_5$ alkyl, or $C_2$-$C_5$ alkenyl; $R_5$ and $R_6$ are each independently $C_1$-$C_5$ alkyl, or $C_2$-$C_5$ alkenyl; and n and m are each independently an integer of 1 to 7.

In one embodiment, the silylamine compound, each silicon atom of two aminosilyl groups in the silazane backbone necessarily has one hydrogen atom attached thereto, such that the silylamine compound has a more excellent effect as the precursor for depositing a silicon-containing thin film.

In one embodiment, in Chemical Formula 2 or 3, $R_5$ and $R_6$ may be each independently $C_1$-$C_5$ alkyl or $C_2$-$C_5$ alkenyl; and n and m are each independently an integer of 1 to 4. In further embodiments, $R_5$ and $R_6$ may be each independently $C_1$-$C_5$ alkyl; and n and m are each independently an integer of 1 to 3.

In one embodiment, the silylamine compound represented by Chemical Formula 1 is a compound represented by the following Chemical Formula 4 in which both sides of an NH group are symmetric to each other in order to have more excellent effect as the precursor for depositing a silicon-containing thin film:

Chemical Formula 4

$$\left[ \begin{array}{c} R_1 \\ \diagdown \\ R_2 \diagup \end{array} N - \underset{\underset{H}{|}}{\overset{\overset{R_5}{|}}{Si}} \right]_2 NH$$

wherein $R_1$ and $R_2$ are each independently hydrogen, $C_1$-$C_7$ alkyl, or $C_2$-$C_7$ alkenyl, or $R_1$ and $R_2$ are linked to each other to form a ring; and $R_5$ is $C_1$-$C_7$ alkyl or $C_2$-$C_7$ alkenyl.

In one embodiment, the silylamine compound represented by Chemical Formula 1 may be selected from the following compounds:

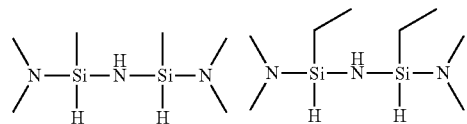

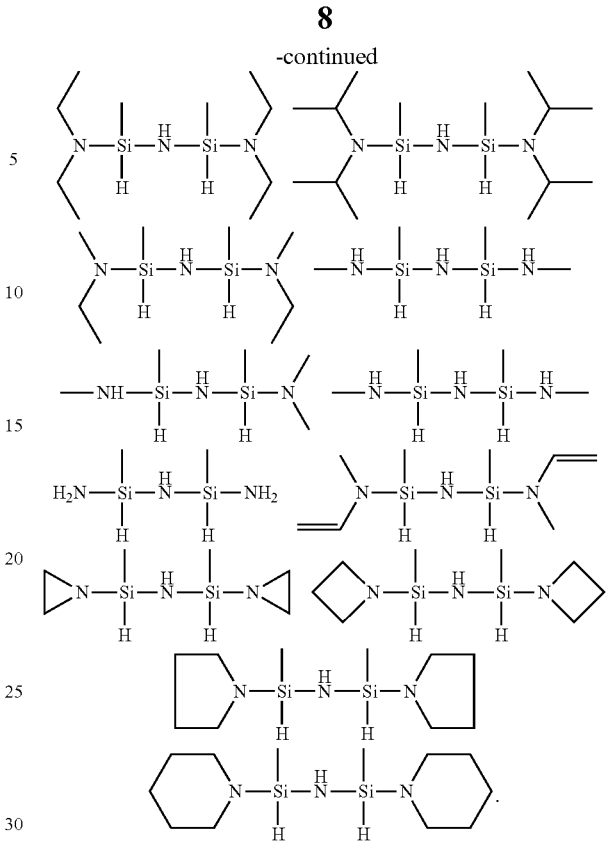

In one embodiment, the composition for depositing a silicon-containing thin film contains the silylamine compound represented by Chemical Formula 1 as the precursor for depositing a thin film, and the silylamine compound in the composition for depositing a silicon-containing thin film may be contained in a content range in which the content may be recognized by those skilled in the art in consideration of film formation conditions, a thickness, properties, or the like, of the thin film.

As used herein, the term "alkyl" means a linear, branched, and cyclic saturated and unsaturated hydrocarbons having 1 to 7 carbon atoms, preferably, 1 to 5 carbon atoms, and more preferably 1 to 3 carbon atoms, and examples thereof may include methyl, ethyl, propyl, butyl, isobutyl, pentyl, and the like.

As used herein, "halogen" refers to a halogen element, and examples thereof include fluoro, chloro, bromo, iodo.

As disclosed herein, the term "alkenyl" as a single group or a part of another group means a straight-chain, branched-chain, or cyclic hydrocarbon radical having 2 to 7 carbon atoms and one or more carbon-carbon double bonds. A more preferable alkenyl radical is a lower alkenyl radical having 2 to 5 carbon atoms. The most preferable lower alkenyl radical is a lower alkenyl radical having about 2 to 3 carbon atoms. Further, an alkenyl group may be substituted at a random usable attachment point. Examples of the alkenyl radical include ethenyl, propenyl, allyl, butenyl, and 4-methylbutenyl. The terms "alkenyl" and "lower alkenyl" include radicals having cis and trans orientations or alternatively, E and Z orientations.

As used herein, the phrase "$R_1$ and $R_2$, and $R_3$ and $R_4$ are each independently linked to each other to form a ring" includes the case in which $R_1$ and $R_2$ are linked to each other to form a ring but $R_3$ and $R_4$ do not form a ring; the case in which on the contrary, $R_1$ and $R_2$ do not form a ring but $R_3$ and $R_4$ are linked to each other to form a ring; and the case in which $R_1$ and $R_2$ are linked to each other to form a ring and $R_3$ and $R_4$ are linked to each other to form a ring, wherein the formed ring may be an alicyclic or aromatic ring containing N, and preferably, an alicyclic ring.

In one embodiment, the silylamine compound represented by Chemical Formula 1 may be prepared by any method as long as the method may be recognized by those skilled in the art.

According to another embodiment, provided herein is a method for manufacturing a silicon-containing thin film.

Specifically, the method for manufacturing a silicon-containing thin film comprises the steps of:

A) providing a substrate in a reactor;
B) introducing into the reactor at least one silicon precursor; and wherein the at least one silicon precursor has a following Chemical Formula 1:

Chemical Formula 1

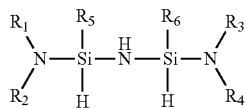

wherein $R_1$ to $R_4$ are each independently hydrogen, $C_1$-$C_7$ alkyl, or $C_2$-$C_7$ alkenyl, or $R_1$ and $R_2$, and $R_3$ and $R_4$ are each independently linked to each other to form a ring; and $R_5$ and $R_6$ are each independently $C_1$-$C_7$ alkyl, or $C_2$-$C_7$ alkenyl.

In one embodiment, the composition for depositing a silicon-containing thin film containing the silylamine compound represented by Chemical Formula 1, which is a liquid at room temperature and has high volatility and excellent thermal stability as the precursor, is used, such that the handling may be easy, it is possible to manufacture various thin films, and it is possible to manufacture a silicon-containing thin film having a high purity at a high deposition rate even at a low temperature and a low power.

In further embodiments, a silicon-containing thin film manufactured by the method according to an embodiment as described herein has excellent durability and electric properties, and/or resistance against hydrogen fluoride and a water vapor transmission rate are also excellent.

In one embodiment, in Chemical Formula 1, $R_5$ and $R_6$ may be each independently $C_{1-5}$ alkyl.

In one embodiment, the silicon precursor has the Chemical Formula 1 may be represented by Chemical Formula 2 or 3:

Chemical Formula 2

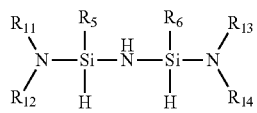

Chemical Formula 3

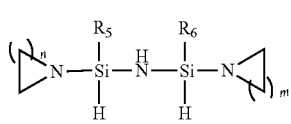

wherein $R_{11}$ to $R_{14}$ are each independently hydrogen, $C_1$-$C_5$ alkyl, or $C_2$-$C_5$ alkenyl; $R_5$ and $R_6$ are each independently $C_1$-$C_5$ alkyl, or $C_2$-$C_5$ alkenyl; and n and m are each independently an integer of 1 to 7.

In one embodiment, in Chemical Formula 2 or 3, $R_5$ and $R_6$ may be each independently $C_1$-$C_5$ alkyl; and n and m are each independently 1, 2, or 5 to 7.

In one embodiment, the silicon precursor represented by Chemical Formula 1 may be selected from the following compounds but is not limited thereto:

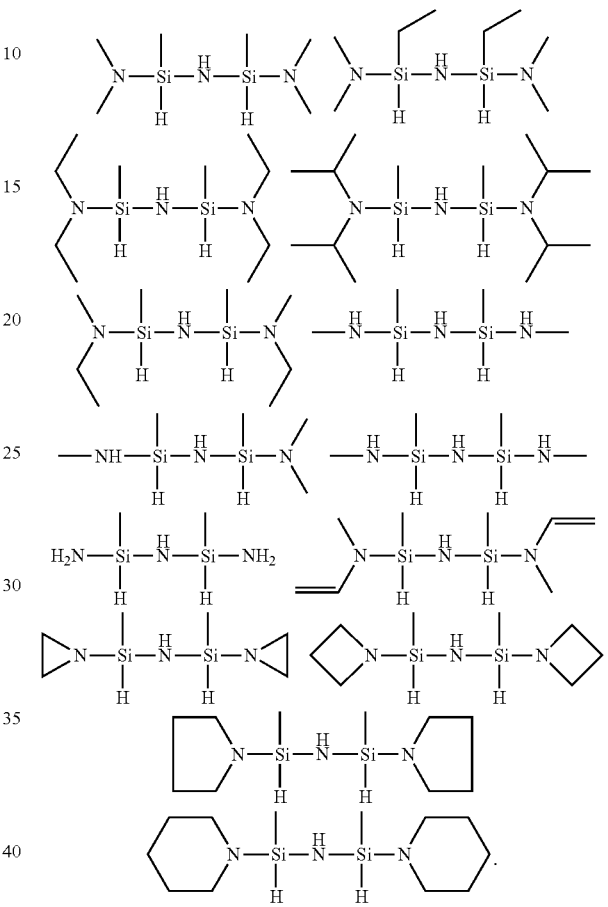

In one embodiment, the silicon-containing thin film may be formed by any method as long as it may be recognized by those skilled in the art. Specifically, the silicon-containing thin film may be formed by an atomic layer deposition (ALD) method, a chemical vapor deposition (CVD) method, a metal-organic chemical vapor deposition (MOCVD) method, a low-pressure chemical vapor deposition (LPCVD) method, a plasma enhanced chemical vapor deposition (PECVD) method, and/or a plasma enhanced atomic layer deposition (PEALD) method, but PECVD, ALD, or PEALD is more preferable in order to allow the thin film to be more easily deposited, and allow the manufactured thin film to have excellent properties.

In one embodiment, the silicon-containing thin film may be a silicon oxide (SiO2) film, a silicon oxy carbide (SiOC) film, a silicon oxy caronitride (BCN) film, a silicon nitride (SiN) film, a silicon oxy nitride (SiON) film, a silicon carbonitride (SiCN) film, and/or a silicon carbide (SiC) film, and various thin films having high quality may be manufactured.

In one embodiment, the method for manufacturing a silicon-containing thin film may comprise:

a) maintaining a temperature of the substrate mounted in a chamber at 30 to 500° C.;

b) contacting the silicon precursor has the Chemical Formula 1 with the substrate to adsorb the silicon precursor in the substrate; and c) injecting a reaction gas into the substrate in which the silicon precursor is adsorbed to form a silicon-containing thin film.

In one embodiment, the method for manufacturing a silicon-containing thin film may comprise:

a') maintaining a temperature of the substrate mounted in a chamber at 30 to 500° C.;

b') contacting the silicon precursor has the Chemical Formula 1 with the substrate to adsorb the silicon precursor in the substrate;

c') purging the remaining composition for depositing a silicon-containing thin film (e.g., a composition containing the silicon precursor) and by-products;

d') injecting a reaction gas into the substrate in which the silicon precursor is adsorbed to form a silicon-containing thin film; and e') purging the remaining reaction gas and by-products, wherein the reaction gas in step d') may remove a ligand of the silylamine compound contained in the composition for depositing a silicon-containing thin film to form a Si—O atomic layer.

In one embodiment, the reaction gas may be supplied after being activated by generating plasma at a plasma power of about 50 to about 1000 W.

In one embodiment, deposition conditions may be adjusted depending on a structure or thermal properties of a desired thin film. Examples of the deposition condition may comprise an injection flow rate of the composition for depositing a silicon-containing thin film containing the silylamine compound, injection flow rates of the reaction gas and a carrier gas, pressure, RF power, the temperature of the substrate, and the like. As non-restrictive examples of the deposition conditions, the injection flow rate of the composition for depositing a silicon-containing thin film may be adjusted in a range of about 10 to about 1000 cc/min, the injection flow rate of the carrier gas may be adjusted in a range of about 10 to about 1000 cc/min, the injection flow rate of the reaction gas may be adjusted in a range of about 1 to about 1500 cc/min, the pressure may be adjusted in a range of about 0.5 to about 10 torr, the RF power may be adjusted in a range of about 50 to about 1000 W, or about 400 to about 800 W, and the temperature of the substrate may be adjusted in a range of about 30 to about 500° C., about 50 to about 200° C., or about 50 to about 100° C., but the deposition conditions are not limited thereto.

In one embodiment, the reaction gas is not limited, but may be one selected from hydrogen ($H_2$), hydrazine ($N_2H_4$), ozone ($O_3$), oxygen ($O_2$), nitrous oxide ($N_2O$) ammonia ($NH_3$), nitrogen ($N_2$), silane ($SiH_4$), borane ($BH_3$), diborane ($B_2H_6$), and phosphine ($PH_3$), or a mixed gas of one or more thereof, and the carrier gas may be one selected from nitrogen ($N_2$), argon (Ar), and helium (He), or a mixed gas of two or more thereof.

In one embodiment, the substrate may be a substrate containing one or more semiconductor materials selected from Si, Ge, SiGe, GaP, GaAs, SiC, SiGeC, InAs, and InP; a silicon-on-insulator (SOI) substrate; a quartz substrate; a glass substrate for a display; or a flexible plastic substrate made of polyimide, polyethylene terephthalate (PET), polyethylene naphthalate (PEN), polymethylmethacrylate (PMMA), polycarbonate (PC), polyethersulfone (PES), polyester, and the like, but is not limited thereto.

Further, the silicon-containing thin film may be directly formed on the substrate. Alternatively, a large number of conductive layers, dielectric layers, insulating layers, or the like, may also be formed between the substrate and the silicon-containing thin film.

According to another embodiment, provided herein is a silicon-containing thin film manufactured according to an embodiment.

In one embodiment, the silicon-containing thin film may have a water vapor transmission rate of about 5.2E-2 g/($m^2$-day) or less as measured by ISO 15106-3 test method (Temperature 37.8° C., Barometric Pressure 760.00 mmHg, Relative Humidity 100.0%).

In one embodiment, the silicon-containing thin film may have a water vapor transmission rate of about 2.2E-2 g/($m^2$-day) or less as measured by ISO 15106-3 test method (Temperature 37.8° C., Barometric Pressure 760.00 mmHg, Relative Humidity 100.0%).

According to another embodiment, provided herein is a display encapsulant comprising a silicon-containing thin film manufactured by the method according to an embodiment.

In one embodiment, the display encapsulant may be an encapsulant of an organic light emitting diode (OLED).

According to another embodiment, provided herein is an insulating film of a semiconductor device comprising a silicon-containing thin film manufactured by the method according to an embodiment.

In one embodiment, the composition for depositing a silicon-containing thin film contains a silylamine which is a liquid at room temperate and has high volatility and excellent thermal stability as a precursor, such that a high-quality silicon-containing thin film having high purity and durability may be provided under lower plasma power and film formation temperature conditions.

Further, in a method for manufacturing a silicon-containing thin film, an excellent deposition rate and excellent stress intensity may be implemented even under a low film formation temperature condition, and in a silicon-containing thin film manufactured thereby, contents of impurities such as carbon, oxygen, and hydrogen are minimized, such that the silicon-containing thin film may have a high purity, excellent physical and electrical properties, and excellent water vapor transmission rate.

The present embodiments will be described in detail with reference to the following Examples. The terms and words used in the present specification and claims should not be interpreted as being limited to typical meanings or dictionary definitions, but should be interpreted as having meanings and concepts relevant to the technical scope of the present embodiments based on the rule according to which an inventor can appropriately define the concept of the term to describe most appropriately the best method he or she knows for carrying out the present embodiments.

Therefore, configurations described in the embodiments and shown in the drawings of the present specification indicate only examples rather than indicating all the technical ideas of the present disclosure and therefore, it is to be understood that various equivalents and modifications that can replace the above configurations may be present.

Further, in all the following Examples, deposition was performed by a plasma enhanced atomic layer deposition (PEALD) method known in the art using a commercialized 200 mm single wafer shower head type ALD apparatus (CN1, Atomic Premium, Korea). In addition, deposition was performed by a plasma enhanced chemical vapor deposition (PECVD) method known in the art using a commercialized 200 mm single wafer shower head type CVD (PECVD) apparatus (CN1, Atomic Premium, Korea).

A thickness of a deposited silicon-containing thin film was measured using an ellipsometer (OPTI-PROBE 2600, THERMA-WAVE, Milpitas, Calif.), and properties of the thin film were analyzed using infrared spectroscopy (IFS66V/S & Hyperion 3000, Bruker Optics, Ettlingen, Baden-Wurttemberg, Germany), X-ray photoelectron spectroscopy. Further, a water vapor transmission rate (WVTR) was measured using a WVTR analyzer (Aquatran 2, Ametek Mocon, Minn., USA), an amount of nitrogen used in measurement was 20 ml/min-Air, and a WVTR measurement area was set to 50 cm². Stress was measured using a Frontier semiconductor (FSM500TC), a measurement area was set to 160 mm, and a thickness of a silicon wafer was set to 0.725 μm, such that properties of the thin film were analyzed.

Example 1: Preparation of Bis(dimethylaminomethylsilyl)amine

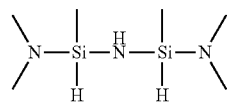

Under an anhydrous and inert atmosphere, after putting hexamethyl disilazane (((CH$_3$)$_3$Si)$_2$NH, 250 g (1.55 mol)) and aluminum chloride (AlCl$_3$, 10 g (0.075 mol)) into a 2000 mL flame-dried flask, dichloro methylsilane (CH$_3$SiHCl$_2$, 713.19 g (6.20 mol)) was slowly added thereto while stirring the mixture and maintaining a temperature at 25° C. Then, a reaction solution was slowly heated to 40° C. This mixture reaction solution was stirred for 3 hours, aluminum chloride (AlCl$_3$) was removed therefrom by filtration, and the formed chlorotrimethylsilane ((CH$_3$)$_3$SiCl) and excess dichloro methylsilane (CH$_3$SiHCl$_2$) were removed by simple distillation or distillation under reduced pressure. While stirring a recovered bis(chloromethylsilyl)amine ((CH$_3$SiHCl)$_2$NH)) solution and maintaining the temperature at −15° C., dimethylamine ((CH$_3$)$_2$NH, 293.47 g (4.2 mol)) was slowly added thereto. After the addition was completed, the reaction solution was slowly heated to room temperature and stirred at room temperature for 6 hours. The formed white solid was removed by filtration, thereby obtaining a filtrate. A solvent was removed from this filtrate under reduced pressure, followed by distillation under reduced pressure, thereby obtaining bis(dimethylaminomethylsilyl)amine (CH$_3$SiHN(CH$_3$)$_2$)$_2$NH, 222.54 g (1.16 mol), yield: 75%).

$^1$H-NMR (inC$_6$D$_6$): δ 0.12 (s, 6H, ((CH$_3$SiHN(CH$_3$)$_2$)$_2$NH), 2.47 (s, 12H, ((CH$_3$SiHN(CH$_3$)$_2$)$_2$NH)), 4.43 (m, 2H, ((CH$_3$SiHN(CH$_3$)$_2$)$_2$NH), 2.0 (b, 1H, ((CH$_3$SiHN(CH$_3$)$_2$)$_2$NH).

Comparative Example 1: Preparation of Diisopropylaminosilane

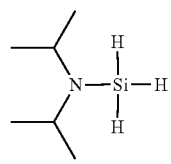

Figure 2:
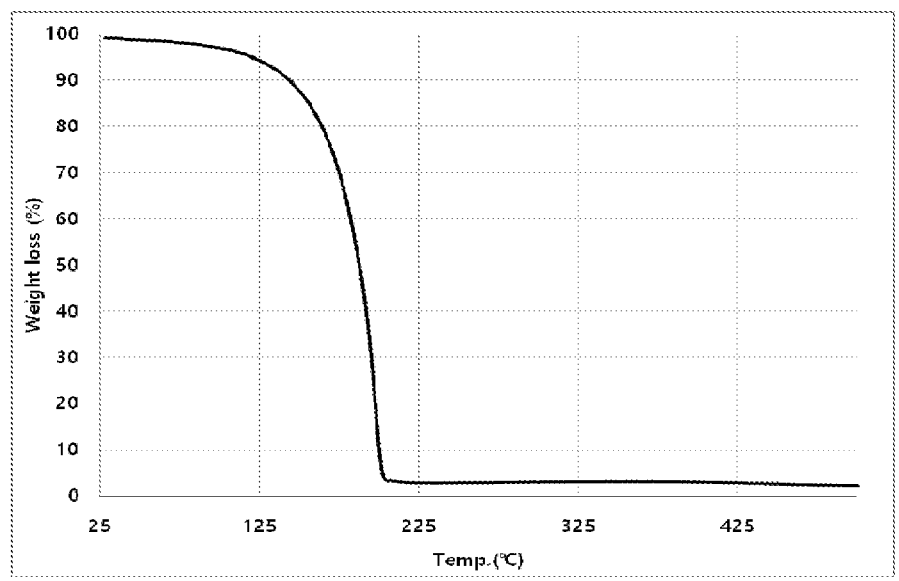
FIG. 2 is a graph illustrating a thermogravimetric analysis result of the bis(dimethylaminomethylsilyl)amine compound prepared in accordance with Example 1.

Diisopropylamine (280.3 g (2.77 mol)) was put into a 3 L flame-dried Schlenk flask, and pentane was added thereto and stirred therewith. While stirring this solution and maintaining a temperature at −20° C., trichlorosilane (187.60 g (1.38 mol)) was slowly added thereto, and the reaction solution was slowly heated to room temperature. This mixture reaction solution was stirred at room temperature for 4 hours, and when a white solid was formed, the white solid was removed by filtration, thereby obtaining a filtrate. A solvent was removed from this filtrate under reduced pressure, and dimethoxymethane (895.89 g (11.77 mol)) was added thereto as a solvent, and lithium hydride (LiH, 27.53 g (3.46 mol)) was slowly added thereto. After addition, the mixture was refluxed for about 6 hours while maintaining a temperature of the flask at 50° C. After reflux, the flask was cooled to room temperature, and a white solid was removed by filtration, thereby obtaining a filtrate. A solvent was removed from the filtrate under reduced pressure, followed by distillation under reduced pressure, thereby obtaining diisopropylaminosilane (136.5 g, yield: 75%). Vapor pressure and thermographic analysis are shown in FIGS. 1 and 2.

$^1$H-NMR (inC$_6$D$_6$): δ 0.93 (d, 6H, (SiH$_3$(N(CH(CH$_3$)$_2$)), 2.47 (m, 2H, (SiH$_3$(N(CH(CH$_3$)$_2$)), 5.65 (s, 3H, (SiH$_3$(NCH(CH$_3$))$_2$)

Example 2: Manufacturing of Silicon Oxide Thin Film by PEALD Using Bis(dimethylaminomethylsilyl)amine Film formation was evaluated using the silylamine compound prepared in Example 1 according to the present disclosure as a composition for forming a silicon oxide film in a general plasma enhanced atomic layer deposition (PEALD) apparatus using a plasma enhanced atomic layer deposition (PEALD) method known in the art. As a reaction gas, nitrous oxide was used together with plasma, and nitrogen corresponding to an inert gas was used for purging. The film was formed at reaction gas and plasma time of 0.5 seconds. A specific method for depositing a silicon oxide thin film was illustrated in Table 1.

Figure 3:
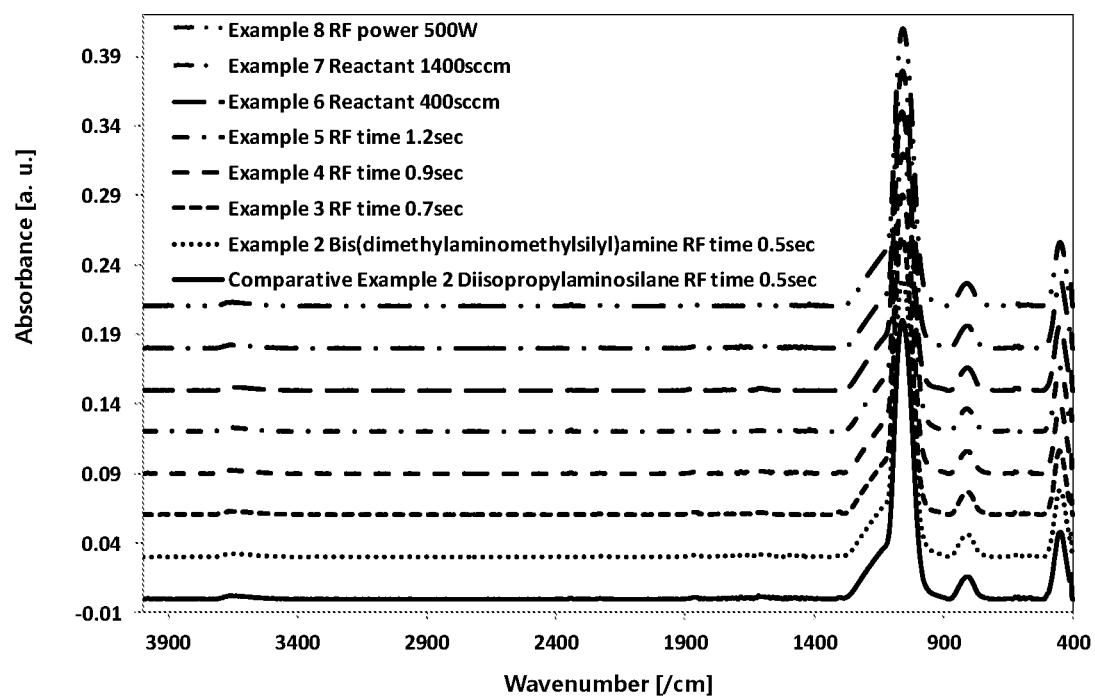
FIG. 3 is a chart illustrating results obtained by performing infrared spectroscopic analysis on deposited films of silicon-containing thin films manufactured in accordance with Examples 2 to 8 and Comparative Example 2.

A thickness of a deposited thin film was measured using the Ellipsometer, formation of the silicon oxide thin film was analyzed using infrared spectroscopy, and a composition of the silicon oxide thin film was analyzed using X-ray photoelectron spectroscopy. Further, stress of the silicon oxide thin film was analyzed using a stress meter, and in order to measure a water vapor transmission rate (WVTR) of the thin film, the WVTR analyzer was used, thereby measuring the WVTR. Specific analysis results of the silicon oxide thin film were illustrated in Table 2, and a result obtained by analyzing the deposited film using infrared spectroscopy was illustrated in FIG. 3.

Examples 3 to 8: Manufacturing of Silicon Oxide Thin Films by PEALD Using Bis(dimethylaminomethylsilyl)amine Film formation was evaluated using the plasma enhanced atomic layer deposition (PEALD) method known in the art in the same manner as in Example 2 except that deposition conditions were changed as illustrated in Table 1 in Example 2. Further, results obtained by analyzing the deposited films using infrared spectroscopy were illustrated in a graph of FIG. 3.

As appreciated in Examples 2 to 8 according to the present disclosure, the silicon oxide thin film deposited at a deposition rate so as to have a thickness of 700 Å at a low temperature using the composition for depositing a silicon-containing thin film, containing bis(dimethylaminomethylsilyl)amine prepared according to the present disclosure was 1.87 to 1.97 Å/cycle, such that the deposition rate was excellent.

More specifically, it may be appreciated that as compared to Comparative Example 2 in which a composition for depositing a silicon-containing thin film, containing diisopropylaminosilane as a precursor of a thin film, the deposition rate and the water vapor transmission rate of the compounds of Examples 2 to 8 in which the composition for depositing a silicon-containing thin film containing a silylamine compound according to the present disclosure as a precursor was used, was improved, which may increase the productivity in forming the silicon-containing thin film. As the results of analyzing the deposited thin films using the infrared spectroscopy in FIG. 3, it may be appreciated that all the thin films formed in Examples 2 to 8 were silicon oxide films. Further, the water vapor transmission rates of the silicon oxide films formed in Examples 6 were 4.5E-3 (g/[m$^2$-day]), such that the silicon oxide films have excellent moisture proof properties. Therefore, it is judged that the silicon oxide thin films may be usefully used in entire application fields of the silicon oxide thin film, particularly, as an encapsulant of an organic light emitting diode (OLED).

Figure 5:
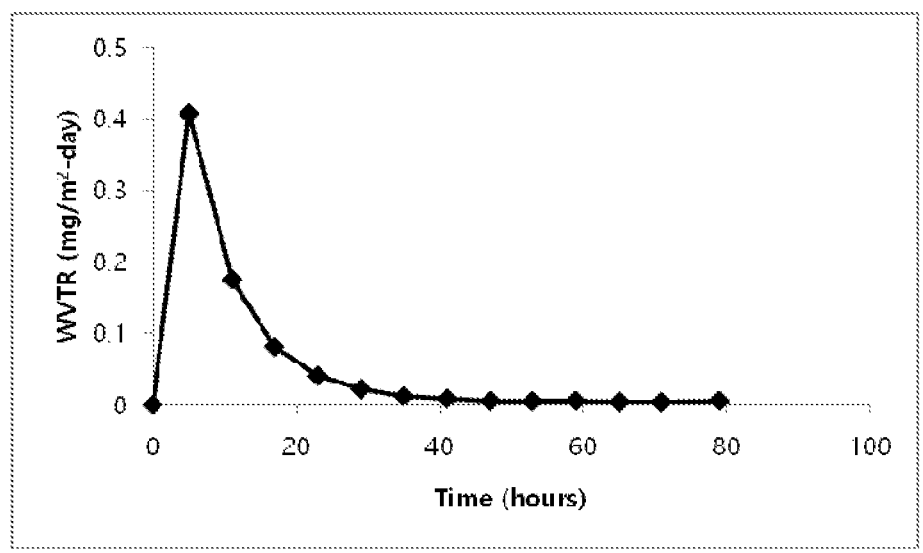
FIG. 5 is a graph showing water vapor transmission rate of a silicon-containing thin film prepared in accordance with Example 6.

A result obtained by measuring a water vapor transmission rate of a silicon-containing thin film prepared in Example 6 was illustrated in FIG. 5. The water vapor transmission rate was constantly maintained for a long period of time as illustrated in FIG. 5. Therefore, it is judged that the compound suggested in the present disclosure may be useful in an OLED device in which an encapsulation technology of blocking oxygen and moisture is important.

Comparative Example 2: Manufacturing of Silicon Oxide Thin Film by PEALD Using Diisopropylaminosilane Film formation was evaluated using the plasma enhanced atomic layer deposition (PEALD) method known in the art under the same deposition conditions as in Example 2 except that diisopropylaminosilane prepared in Comparative Example 1 was used, a heating temperature of the precursor was 20° C., and the number of deposition was 590 cycles as illustrated in the following Table 1. The deposited thin film was analyzed by the same analysis method as in Example 2 under the same conditions as in Example 2, such that analysis results were secured. In order to perform measurement at the same thickness as those of the thin films formed in Examples 2 to 8, the number of deposition cycles was changed. A specific method for depositing a silicon oxide thin film was illustrated in the following Table 1, and properties of the deposited thin films were illustrated in Table 2. As illustrated in Table 2, a deposition rate was 1.19 Å/cycle, and a water vapor transmission rate (WVTR) was 8.0E-2 (g/[m$^2$-day]), which were lower than those of the bis(dimethylaminomethylsilyl)amine in Example 2.

TABLE 1

| | Deposition Conditions of Silicon Oxide Thin Film by PEALD | | | | | | |
|---|---|---|---|---|---|---|---|
| | | Precursor | | Purge | | Reaction Gas and Plasma | |
| | Temperature of Substrate (° C.) | Heating Temperature (° C.) | Injection Time (sec) | Flow Rate (sccm) | Time (sec) | Flow Rate (sccm) | RF Power (W) |
| Example 2 | 90 | 70 | 0.1 | 600 | 0.4 | 800 | 400 |
| Example 3 | 90 | 70 | 0.1 | 600 | 0.4 | 800 | 400 |
| Example 4 | 90 | 70 | 0.1 | 600 | 0.4 | 800 | 400 |
| Example 5 | 90 | 70 | 0.1 | 600 | 0.4 | 800 | 400 |
| Example 6 | 90 | 70 | 0.1 | 600 | 0.4 | 400 | 400 |
| Example 7 | 90 | 70 | 0.1 | 600 | 0.4 | 1400 | 400 |
| Example 8 | 90 | 70 | 0.1 | 600 | 0.4 | 800 | 500 |
| Comparative Example 2 | 90 | 20 | 0.1 | 600 | 0.4 | 800 | 400 |

| | Reaction Gas and Plasma Time (sec) | Reaction Gas Purge | | No. of Depositions Cycle | Process Time (sec) |
|---|---|---|---|---|---|
| | | Time (sec) | Flow Rate (sccm) | | |
| Example 2 | 0.5 | 0.1 | 300 | 380 | 418 |
| Example 3 | 0.7 | 0.1 | 300 | 363 | 471.9 |
| Example 4 | 0.9 | 0.1 | 300 | 370 | 555 |
| Example 5 | 1.2 | 0.1 | 300 | 370 | 666 |
| Example 6 | 0.9 | 0.1 | 300 | 370 | 555 |
| Example 7 | 0.9 | 0.1 | 300 | 370 | 555 |
| Example 8 | 0.9 | 0.1 | 300 | 370 | 555 |
| Comparative Example 2 | 0.5 | 0.1 | 300 | 590 | 649 |

TABLE 2

Evaluation of Properties of Silicon Oxide Thin Film

| | Variable | Deposition Rate (Å/cycle) | Thickness of Thin Film (Å) | Refractive Index | O/Si Composition Ratio | Stress of Film (MPa) | WVTR (g/[m² – day]) |
|---|---|---|---|---|---|---|---|
| Example 2 | Plasma Time of 0.5 sec | 1.87 | 710 | 1.46 | 1.73 | −134 | Unmeasured |
| Example 3 | Plasma Time of 0.7 sec | 1.95 | 723 | 1.47 | 1.73 | −193 | Unmeasured |
| Example 4 | Plasma Time of 0.9 sec | 1.95 | 721 | 1.47 | 1.73 | −149 | 2.0E−2 |
| Example 5 | Plasma Time of 1.2 sec | 1.92 | 711 | 1.48 | 1.73 | −293 | 2.5E−2 |
| Example 6 | Reaction Gas of 400 sccm | 1.97 | 731 | 1.48 | 1.72 | −250 | 4.5E−3 |
| Example 7 | Reaction Gas of 1400 sccm | 1.92 | 711 | 1.47 | 1.73 | −120 | 5.2E−2 |
| Example 8 | RF Power of 500 W | 1.95 | 720 | 1.48 | 1.73 | −151 | 1.1E−2 |
| Comparative Example 2 | Plasma Time of 0.5 sec | 1.19 | 702 | 1.48 | 1.73 | −272 | 8.0E−2 |

Example 9: Manufacturing of Silicon Nitride Thin Film by PEALD Using Bis(dimethylaminomethylsilyl)amine Film formation was evaluated using the silylamine compound prepared in Example 1 according to the present disclosure as a composition for forming a silicon nitride film in a general plasma enhanced atomic layer deposition (PEALD) apparatus using a plasma enhanced atomic layer deposition (PEALD) method known in the art. As a reaction gas, nitrogen and ammonia were used together with plasma as first reaction gas, and nitrogen was used as a second reaction gas. The nitrogen corresponding to an inert gas was used for purging. A specific method for depositing a silicon nitride thin film was illustrated in Table 3.

Figure 4:
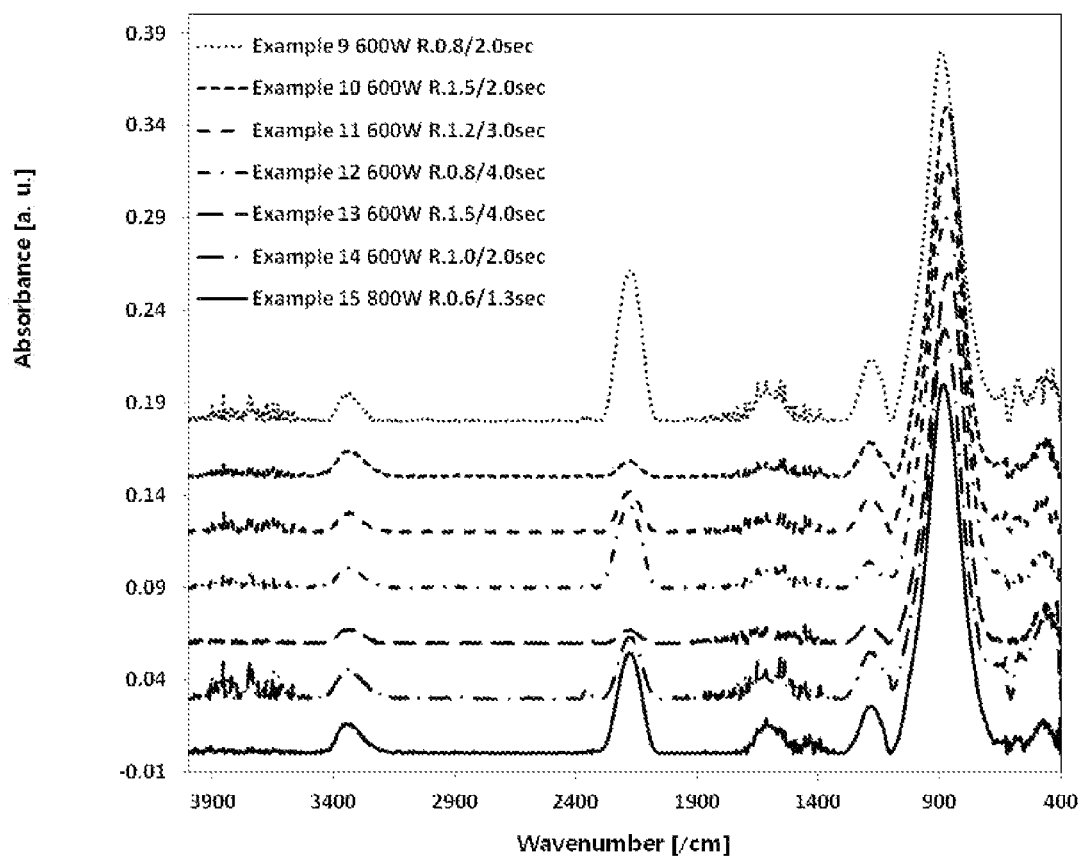
FIG. 4 is a chart illustrating results obtained by performing infrared spectroscopic analysis on deposited films of silicon-containing thin films manufactured in accordance with Examples 9 to 15.

A thickness of a deposited thin film was measured using an Ellipsometer, formation of the silicon nitride thin film was analyzed using infrared spectroscopy, and a composition of the silicon nitride thin film was analyzed using X-ray photoelectron spectroscopy. Further, in order to measure a water vapor transmission rate (WVTR) of the thin film, a WVTR analyzer was used, thereby measuring the WVTR. Specific analysis results of the silicon nitride thin film were illustrated in the following Table 4, and results obtained by analyzing the deposited film using infrared spectroscopy were illustrated in FIG. 4.

Examples 10 to 15 and Comparative Example 3: Manufacturing of Silicon Nitride Thin Films by PEALD Using Bis(dimethylaminomethylsilyl)amine or Diisopropylaminosilane Film formation was evaluated using a plasma enhanced atomic layer deposition (PEALD) method known in the art in the same manner as in Example 9 except for changing deposition conditions as in Table 3, and the deposited thin film was analyzed by the same analysis method as in Example 9 under the same conditions as in Example 9, such that analysis results were secured. A specific method for depositing a silicon nitride thin film and analysis results were illustrated in the following Tables 3 and 4. Further, the deposited films were analyzed using infrared spectroscopy, and the result was illustrated in FIG. 4. As a result, it may be appreciated that the thin film manufactured in Examples 10 to 15 were silicon nitride thin films.

Figure 6:
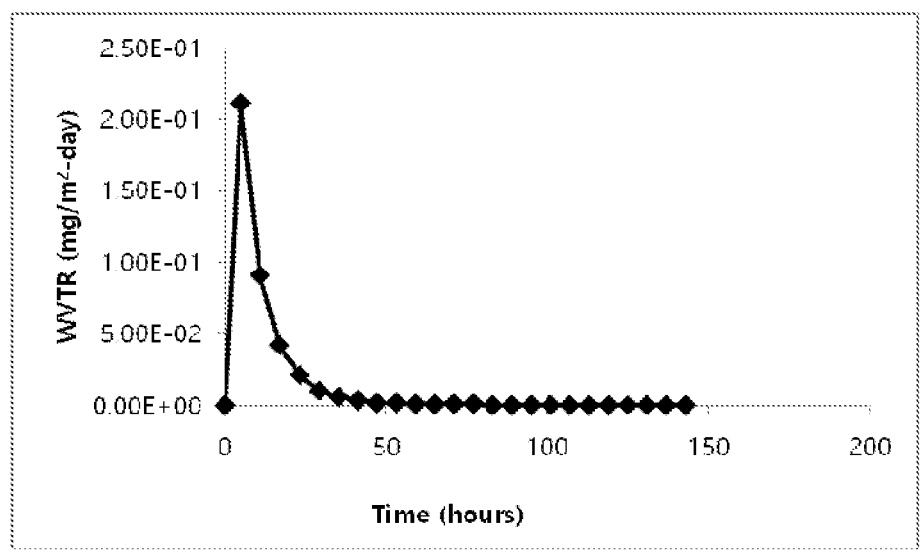
FIG. 6 is a graph showing water vapor transmission rate of a silicon-containing thin film prepared in accordance with Example 11.

Further, a result obtained by measuring a water vapor transmission rate of a silicon-containing thin film prepared in Example 11 was illustrated in FIG. 6. The water vapor transmission rate was constantly maintained for a long period of time as illustrated in FIG. 6. Therefore, it is judged that the compound suggested in the present disclosure may be significantly usefully used in an OLED device in which an encapsulation technology of blocking oxygen and moisture is important.

TABLE 3

Deposition Conditions of Silicon Nitride Thin Film by PEALD

| | Precursor | | | Purge | | Reaction Gas and Plasma | | |
|---|---|---|---|---|---|---|---|---|
| | Temperature of Substrate (° C.) | Heating Temperature (° C.) | Injection Time (sec) | Flow Rate (sccm) | Time (sec) | Flow Rate (sccm) | RF Power (W) | Time (sec) |
| Example 9 | 90 | 65 | 0.4 | 6000 | 0.4 | 2000 | 600 | 0.8 |
| Example 10 | 90 | 65 | 0.4 | 6000 | 0.4 | 2000 | 600 | 1.5 |
| Example 11 | 90 | 65 | 0.4 | 6000 | 0.4 | 2000 | 600 | 1.2 |

TABLE 3-continued

| | | | | | | | | |
|---|---|---|---|---|---|---|---|---|
| Example 12 | 90 | 65 | 0.4 | 6000 | 0.4 | 2000 | 600 | 0.8 |
| Example 13 | 90 | 65 | 0.4 | 6000 | 0.4 | 2000 | 600 | 1.5 |
| Example 14 | 90 | 65 | 0.4 | 6000 | 0.4 | 2000 | 600 | 1 |
| Example 15 | 90 | 65 | 0.4 | 6000 | 0.4 | 2000 | 800 | 0.6 |
| Comparative Example 3 | 90 | 20 | 0.4 | 6000 | 0.4 | 2000 | 800 | 0.6 |

| | Reaction Gas and Plasma | | | Reaction Gas Purge | | No. of Depositions | Process |
|---|---|---|---|---|---|---|---|
| | Flow Rate (sccm) | RF Power (W) | Time (sec) | Time (sec) | Flow Rate (sccm) | Cycle | Time (sec) |
| Example 9 | 6000 | 600 | 2 | 0.4 | 6000 | 486 | 2139 |
| Example 10 | 6000 | 600 | 2 | 0.4 | 6000 | 547 | 2789 |
| Example 11 | 6000 | 600 | 3 | 0.4 | 6000 | 500 | 2900 |
| Example 12 | 6000 | 600 | 4 | 0.4 | 6000 | 480 | 3068 |
| Example 13 | 6000 | 600 | 4 | 0.4 | 6000 | 604 | 4284 |
| Example 14 | 6000 | 600 | 2 | 0.4 | 6000 | 493 | 2268 |
| Example 15 | 6000 | 800 | 1.3 | 0.4 | 6000 | 432 | 1512 |
| Comparative Example 3 | 6000 | 800 | 1.3 | 0.4 | 6000 | 697 | 2442 |

TABLE 4

Evaluation of Properties of Silicon Nitride Thin Film

| | Variable | Deposition Rate (Å/cycle) | Thickness of Thin Film (Å) | Refractive Index | N/Si Composition Ratio | WVTR (g/[m$^2$ – day]) |
|---|---|---|---|---|---|---|
| Example 9 | Plasma Time of 0.8 sec/2 sec | 0.72 | 350 | 1.82 | 1.32 | 1.7E−3 |
| Example 10 | Plasma Time of 1.5 sec/2 sec | 0.64 | 350 | 1.87 | 1.22 | 2.2E−2 |
| Example 11 | Plasma Time of 1.2 sec/3 sec | 0.7 | 350 | 1.88 | 1.24 | 2.6E−4 |
| Example 12 | Plasma Time of 0.8 sec/4 sec | 0.73 | 350 | 1.89 | 1.25 | 1.7E−2 |
| Example 13 | Plasma Time of 1.5 sec/4 sec | 0.58 | 350 | 1.93 | 1.17 | 3.1E−2 |
| Example 14 | Plasma Time of 1 sec/2 sec | 0.71 | 350 | 1.83 | 1.26 | 4.1E−4 |
| Example 15 | Plasma Power of 800 W Plasma Time of 0.6 sec/1.3 sec | 0.81 | 350 | 1.84 | 1.18 | 2.7E−3 |
| Comparative Example 3 | Plasma Power of 800 W Plasma Time of 0.6 sec/1.3 sec | 0.43 | 350 | 1.88 | 1.24 | 7.2E−3 |

The invention claimed is:

1. A method for manufacturing a silicon-containing thin film comprising the step of:

A) maintaining a temperature of a substrate mounted in a reactor at 30 to 500° C.;

B) contacting at least one silicon precursor of Chemical Formula 1 with the substrate to adsorb the at least one silicon precursor on the substrate; and C) injecting a reaction gas into the substrate in which the at least one silicon precursor is adsorbed to form a silicon-containing thin film;

Chemical Formula 1

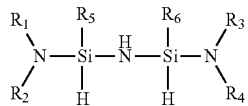

wherein $R_1$ and $R_3$ are each hydrogen, wherein $R_2$ and $R_4$ are each independently hydrogen, $C_1$-$C_7$ alkyl, or $C_2$-$C_7$ alkenyl; and wherein $R_5$ and $R_6$ are each independently $C_1$-$C_7$ alkyl, or $C_2$-$C_7$ alkenyl.

2. The method of claim 1, wherein $R_5$ and $R_6$ are each independently $C_1$-$C_5$ alkyl.

3. The method of claim 1, wherein the silicon precursor is selected from the following compounds:

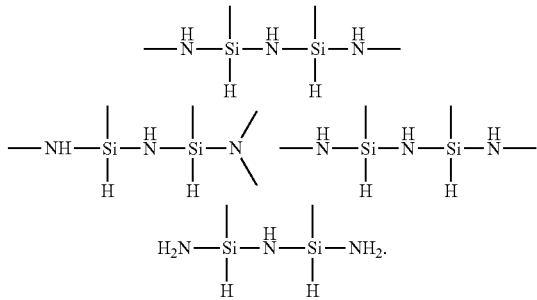

4. The method of claim 1, wherein the method further comprises the step of depositing the at least one silicon precursor on the substrate, wherein the depositing is performed by an atomic layer deposition method, a chemical vapor deposition method, a metal-organic chemical vapor deposition method, a low-pressure chemical vapor deposition method, a plasma-enhanced chemical vapor deposition method, or a plasma-enhanced atomic layer deposition method.

5. The method of claim 1, wherein the silicon-containing thin film is a silicon oxide film, a silicon oxy carbide film, a silicon oxy carbonitride film, a silicon nitride film, a silicon oxy nitride film, a silicon carbonitride film, or a silicon carbide film.

6. The method of claim 1, wherein the reaction gas is supplied after being activated by generating plasma with a plasma power of 50 to 1000 W.

7. The method of claim 1, wherein the temperature of the substrate is maintained at 50 to 200° C.

8. A silicon-containing thin film manufactured by the method according to claim 1.

9. The silicon-containing thin film of claim 8, wherein the silicon-containing thin film has a water vapor transmission rate of 5.2E-2 g/($m^2$-day) or less as measured by ISO 15106-3 test method.

10. The silicon-containing thin film of claim 8, wherein the silicon-containing thin film has a water vapor transmission rate of 2.2E-2 g/($m^2$-day) or less as measured by ISO 15106-3 test method.

11. A display encapsulant comprising a silicon-containing thin film manufactured by the method according to claim 1.

12. An insulating film of a semiconductor device comprising a silicon-containing thin film manufactured by the method according to claim 1.

13. A method for manufacturing a silicon-containing thin film, the method comprising:
    synthesizing a silicon precursor of Chemical Formula 1, wherein synthesizing the silicon precursor of Chemical Formula 1 comprises:
        combining hexamethyl disilazane and aluminum chloride under anhydrous and inert atmosphere;
        adding dichloromethylsilane to the hexamethyl disilazane and the aluminum chloride while stirring at a constant temperature;
        removing byproducts by filtration and distillation to generate a first solution;
        reacting the first solution with dimethylamine; and
        after reacting the first solution with the dimethylamine, isolating the silicon precursor of Chemical Formula 1 by collecting the resulting precipitate via filtration;
    maintaining a temperature of a substrate mounted in a reactor at 30 to 500° C.;
    contacting the silicon precursor of Chemical Formula 1 with the substrate to adsorb the silicon precursor of Chemical Formula 1 on the substrate; and
    injecting a reaction gas into the substrate in which the silicon precursor of Chemical Formula 1 is adsorbed to form a silicon-containing thin film;

Chemical Formula 1

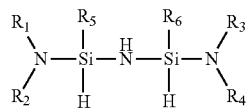

wherein $R_1$ to $R_4$ are each independently hydrogen, $C_1$-$C_7$ alkyl, or $C_2$-$C_7$ alkenyl, or $R_1$ and $R_2$, and $R_3$ and $R_4$ are each independently linked to each other to form a ring; and wherein $R_5$ and $R_6$ are each independently $C_1$-$C_7$ alkyl, or $C_2$-$C_7$ alkenyl.

* * * * *